United States Patent [19]

Ohtsuka et al.

[11] Patent Number: 4,879,588
[45] Date of Patent: Nov. 7, 1989

[54] INTEGRATED CIRCUIT PACKAGE

[75] Inventors: Akira Ohtsuka; Tomoji Goto, both of Hyogo; Masao Ida, Tokyo, all of Japan

[73] Assignees: Sumitomo Electric Industries, Ltd., Osaka; Nippon Telegraph and Telephone Corporation, Tokyo, both of Japan

[21] Appl. No.: 145,068

[22] Filed: Jan. 19, 1988

[30] Foreign Application Priority Data

Jan. 19, 1987 [JP] Japan .................................. 62-10929

[51] Int. Cl.[4] ..................... H01L 23/48; H01L 29/44; H01L 29/60; H01L 39/02
[52] U.S. Cl. ........................................ 357/68; 357/71; 357/74; 357/80
[58] Field of Search ........................ 357/74, 80, 71, 68

[56] References Cited

U.S. PATENT DOCUMENTS

| | | | |
|---|---|---|---|
| 3,577,181 | 5/1971 | Belohoubek | 357/74 |
| 3,626,259 | 12/1971 | Garboushian et al. | 357/74 |
| 3,825,805 | 7/1974 | Belohoubek et al. | 357/80 |
| 4,417,392 | 11/1983 | Ibrahim et al. | 357/80 |
| 4,608,592 | 8/1986 | Miyamoto | 357/80 |
| 4,626,889 | 12/1986 | Yamamoto et al. | 357/68 |
| 4,701,573 | 10/1987 | Bahl et al. | 357/68 |
| 4,725,878 | 2/1980 | Miyauchi et al. | 357/71 R |

*Primary Examiner*—Eugene R. LaRoche
*Assistant Examiner*—Michael B. Shingleton
*Attorney, Agent, or Firm*—Cushman, Darby & Cushman

[57] ABSTRACT

An improved integrated circuit package of the MLCP type suitable for use both at high operating frequencies and with chips dissipating large amounts of power. Electric power supplying wirings and signal transmitting wirings are disposed on entirely separate surfaces, the power transmitting wirings being formed on entire peripheries of respective, dedicated ceramic plates. Termination resistors for the signal wirings though are formed on the same ceramic plates which contain the power supplying wirings.

12 Claims, 2 Drawing Sheets

INTEGRATED CIRCUIT PACKAGE

BACKGROUND OF THE INVENTION

The present invention relates to an integrated circuit package suitable for an integrated circuit used for processing digital signals at high speeds of several hundred Mb/s or more.

An integrated circuit package must fix hold a semiconductor chip and must protect the semiconductor chip from the environment. The integrated circuit (IC) package has the further function of supporting lead frames employed for supplying electric power and for receiving/transmitting various signals.

The integrated circuit package has still further functions of electrically insulating the semiconductor chip and discharging heat generated by the semiconductor chip.

With respect to silicon semiconductor integrated circuits, plastic packages are frequently employed. Plastic packages are made by sealing silicon semiconductor integrated circuit chips in plastic moldings. That is, after the lead frames and the electrode portions of the chip have been connected through wire-bonding to each other with metal wires, the entire structure is molded with a plastic material so as to be sealed.

Lead frames are usually provided on opposite longitudinal side surfaces of the package. A package having lead frames formed in lines on two opposite is called a DIP (dual-in-line package). Eight lead frames or more, sometimes 40 or more, are provided. The interval between the lead frames is standardized, and in many cases is selected to be about 2.5 to 2.9 mm. As the number of lead frames is increased, the package becomes large.

The plastic package has the advantage that its cost is low and an integrated circuit chip can be easily mounted thereon. Therefore, at present plastic packages accounts for about 80% of all produced integrated circuit packages.

The plastic package, however, is inferior in cooling properties as well as in its ability to hermetically seal. Therefore, the plastic package can be used only for an IC chip having a relatively small power dissipation. Because the chip can have only a small dissipation, the integration density or operational speed of the chip is limited.

For IC chips having a large power dissipation, it is required that the package not only have a higher thermal conductivity but also a thermal expansion coefficient approximate to that of the IC chip.

Accordingly, ceramic DIP integrated circuit packages made of alumina ($Al_2O_3$) have been employed. These packages are constituted by two ceramic plates combined with each other.

Such a package is called a CERDIP because it has a DIP arrangement and is made of ceramics. At present, about 15% of all IC packages have the CERDIP arrangement.

The CERDIP package is produced as follows:

A number of lead frames are sealed with a low-melting-point glass on an elongated thin lower ceramic plate. A silicon semiconductor IC chip is die-mounted on the lower ceramic plate, and electrode portions of the IC chip are connected to the lead frames through wire-bonding with Al wires. An upper ceramic plate is fixed to the lower ceramic plate using sealing glass, and then a cover is attached.

The thus-arranged ceramic package has a usable temperature range wider than that of the plastic package. The ceramic package is therefore used for semiconductor devices which have high reliability requirements because the ceramic package has superior cooling properties as well as better hermeticity, and the thermal expansion coefficient of the ceramic package is approximately the same as the IC chip.

In a CERDIP, however, the electrode portions of the IC chip and the lead frames are directly connected to each other through wires, and therefore the lengths of the wires are unavoidably increased as the number of lead frames (pins) is increased.

Long wires may be tolerated in the case of an IC used for low-speed operations. However, the wires are required to be made as short as possible in the case of an IC used for high-speed operations.

Therefore, both the plastic DIP and the ceramic DIP (CERDIP) are both somewhat unsuitable for IC chips used for high-speed operations.

Moreover, silicon semiconductor ICs are themselves inherently satisfactory for high-speed operations.

In the case of a CMOS IC, generally, the maximum operating frequency is limited to about 50 MHz. CMOS ICs though have a small power dissipation, and therefore in many cases plastic packages can be used for CMOS ICs.

Further, for example, in the case of TTL devices, the maximum operating frequency is about 50 to 70 MHz.

In the case of an ECL (emitter-coupled logic) device which is a silicon digital IC capable of high-speed operation, generally, the maximum operating frequency is about 500 MHz. When an ECL device is operated at a high speed, however, the power dissipation is large.

The increase in power dissipation in ECL devices is caused by limitations in the material used in constructing such devices. Silicon semiconductor material is not suitable generally for high-speed operations because of its low electron mobility.

In order to achieve higher-speed operability, it is usually necessary to use an FET (MESFET, MODFET) made of a compound semiconductor such as GaAs or the like. This is because in materials the electron mobility is exceedingly high.

Development of GaAs integrated circuits has been occurring steadily. An integrated circuit mainly constituted by GaAs FETs or the like can generally operate at an ultra-high speed.

It is of course necessary not only or the IC chip itself to be capable of operating at high speeds, but also for its package to not prevent the high-speed operation of the chip.

In the case where a digital signal is processed at a speed of several hundreds Mb/s, generally the signal waveforms are rectangular. When a rectangular wave of a frequency F is expanded in a Fourier series, the series includes components higher in frequency than the fundamental frequency F. In order to perfectly reproduce the rectangular wave, the IC is required to operate at a higher frequency. For example, if a rectangular wave of a frequency of several hundred Mb/S is to be successfully handled, it is required that the IC device have a sinewave amplification capability of several GHz. Such a high-speed signal imposes strict conditions on the IC package.

A high-speed signal cannot be freely transmitted with a lead wire like a low-speed electric signal. The high-speed electric signal can be effectively transmitted only when a suitable relation is satisfied between the width of the lead wire, the thickness of the substrate, etc.

An electric conductor such as a lead wire or the like not only acts as a pure electric conductor but also has self-inductance L. When the frequency is high, the reactance $L\omega$ due to the self-induction L is not negligible. Further, a capacitance C is formed between the signal lines and the ground plane as well as between signal lines. Thus, in the case of a high-speed signal, the problem of L and C is always important. The characteristic impedance $Z_0=\sqrt{L/C}$ is determined by L and C per unit length. The characteristic impedance is required to be made constant along a transmission line because, if a discontinuity of the characteristic impedance is present a reflection is generated at the point of discontinuity. Further, it is necessary to terminate the end of the transmission line with an impedance equal to the characteristic impedance. If not, a signal energy reflection occurs at the end of the transmission line.

Conventionally, the foregoing problem is well known in design of a coaxial cable. In coaxial cables having a characteristic impedance of 50 Ω, 75 Ω, etc., the respective sizes of the signal line, the insulating layer, the ground sheath and the like are made constant so as to prevent the characteristic impedance from varying. Further, in the case of a high-speed signal, the coaxial cable is terminated with a resistor having the characteristic impedance.

The same conditions as described above are required also for IC packages used for high-speed ICs. In such devices, it is necessary that characteristic impedance be made constant and a termination resistor equal to the characteristic impedance provided.

Further, it is preferable to make the inductance L of the lead wire and the size of the wire as small as possible because, if L is large, it is difficult for the input signal reaching an input electrode of the IC to not be deteriorated in its waveform. Generally, the selfinduction of the electric conductor increases as the sectional area thereof becomes smaller or the wire is elongated.

In the package, there are present electric conductors such as lead frames, metallized wiring, an electric conductor pattern in the IC chip, bonding wires, etc. Among them, the electric conductor pattern and the wires are particularly thin.

The wires have a considerably large inductance L because they are thin, and therefore they should be made as short as possible. To this end, it is impossible to directly connect the electrode portions of the IC chip to the lead frames through wires, unlike the conventional IC package, because the wires become longer as the number of lead frame as is increased.

Further, there is a disadvantage in that the number of power sources is increased. TTL devices, CMOS devices, etc., presently on the market can be driven by a single power source. In the case of an IC having high-speed logical elements, however, three power sources are sometimes required. In such a case, it is necessary to form four separate power source lines, including the ground line (of a reference potential).

Further, the power source and the ground line are required to be connected to various portions of the IC chip. Since it is preferable to make all wires as short as possible, metallized wirings are sometimes used for power source wirings and the ground wirings. For this purpose, ten metallized wirings or more are sometimes required to be used as the power source wires.

Further, in an IC used for high-speed operations, the heat generated from the semiconductor chip thereof is inevitably high. Accordingly, in a package used for high-speed ICs, it is particularly important to improve the cooling property thereof so as to increase the reliability of the device.

FIG. 1 shows an example of the best known conventional package used for high-speed integrated circuits. In the drawings, the package in the state where a ceramic cover plate is removed is illustrated. This package is called a ceramic package of the flat type so as to be distinguished from a CERDIP.

A square ceramic main plate 1 having a square opening at its central portion is provided at its lower surface with a bottom plate 11 fixed thereto. The bottom plate 11 is also made of ceramic. Metallized wiring 3 radially extending from the opening of the ceramic main plate 1 to side edges of the same are formed on the ceramic main plate 1. A ceramic frame 7 is fixed to the ceramic main plate 1. A cover plate (not shown) is attached to the frame 7.

Lead frames 10 are attached by brazing to the respective termination portions of the metallized wirings 3. Although the lead frames 10 extend in four directions in this example, the lead frames 10 may extend only in two directions so as to form a DIP arrangement. The metallized wirings include a signal line and power source line, which are disposed on the same plane. Including the cover plate, this package has four ceramic plates stacked one on the other.

The package constituted by three or more stacked ceramic plates as described above is called an MLCP (multi-laminated ceramic package).

At present, MLCPs account for about 3% of all IC packages. MLCPs, however, are exceedingly expensive in comparison with plastic packages.

When an IC chip is mounted on the package, the IC chip is die-mounted to the bottom plate 11, and electrode portions of the chip are connected to the start points of the metallized wirings by wire-bonding with gold wires.

In this package, the lead frames are connected to the wires through the metallized wiring, and hence it has an advantage that the wires are not long, even when the number of lead frames is increased.

When the number of input and output signals is increased to thereby increase the number of power source lines, however, the wires unavoidably become long. That is, since the intervals between the metallized wirings and the widths of each of the metallized wirings are limited, the opening portion of the ceramic plate must be several times as wide as the size of the IC chip if the number of wirings is increased. In such a case, the bonding wires become so long that the value of L become large, making it difficult to transmit signals to the semiconductor chip with no deterioration.

At present, the MLCP package of FIG. 1 is the most technically developed IC package. In this package, metallized wirings are formed on each of the ceramic plates, which are vertically stacked one on the other. Even if the number of wirings is increased, it is not necessary to make the opening portions of the respective ceramic plates longer, and therefore the wires connected the IC chip to the metallized wirings can be made shorter than was possible in the DIP-type packages. Accordingly, this package has the advantage that the inductance L of the wires is less than the other kinds of packages.

Although the MLCP shown in FIG. 1 is the best package known at present, the MLCP still has the disadvantage that the wires must become long, increasing the inductance L, if the number of wirings is increased above a certain amount.

In a package having a plurality of stacked ceramic plates each having metallized wirings formed thereon, vertical signal lines must generally also be employed so that the amount of cross-coupling between signal lines is increased. As a result, mixing or interference between signals is apt to be caused.

Further, there is another difficulty in that, since the signal lines and the power source lines formed on the vertically arranged ceramic plates are connected to each other via through holes, the characteristic impedance $\sqrt{L/C}$ cannot be made constant.

Moreover, this package fails to provide any terminating resistance equal to the characteristic impedance. Therefore, when an input signal is applied to a signal line, reflection of the signal occurs inevitably at the end of the metallized wiring.

It is difficult to provide, for example, chip resistors of 50 Ω, when the number of input signals is increased. Although suitable for use in hybrid ICs or the like, such resistor chips are too large to be mounted on the metallized wirings of the package. Further, even if such a chip resistor were mounted on the metallized wiring, it would be difficult to attach the chip resistor to the end of the metallized wiring, that is, at the connection point between the metallized wiring and the wire.

The conventional IC package has served only as a so-called package, and has never been provided with any built-in resistors.

Further, although a MLCP has a good cooling property in comparison with a plastic package, in the case where a semiconductor chip mounting portion of the MLCP is made of alumina, the thermal resistance is 40 to 50° C./W because the thermal conductivity of alumina is about 0.05 cal/cm sec ° C. Accordingly, the MLCP is unsatisfactory in view of its cooling property as a package for an ultra-high-speed IC having a large power dissipation. Further, if a terminating resistor, which is a heat generating element, is formed in the IC package, it becomes a more serious problem as to how to improve the cooling property in order to maintain the reliability of the semiconductor device and in order to minimize the limitations imposed by the TCR (resistance temperature coefficient) of the resistor material.

SUMMARY OF THE INVENTION

Accordingly, it is a first object of the present invention to provide an integrated circuit package in which the characteristic impedance of the signal lines is made uniform.

It is a second object of the present invention to provide an integrated circuit package in which a input signal line of metallized wirings is terminated by a resistor equal to the characteristic impedance.

It is a third object of the present invention to provide an integrated circuit package in which the length of the bonding wires is not long, even if the number of wirings is high.

It is a fourth object of the present invention to provide an integrated circuit package in which it is easy to perform wire-bonding, even in the case where it is necessary to connect a power source and ground to many portions of the IC chip.

It is a fifth object of present invention to provide a device having a high reliability in which it is possible to efficiently discharge heat generated by resistors formed in an IC chip and a package.

The package according to the present invention is constituted by a lamination of a plurality of ceramic plates, each having metallized wirings formed on an upper surface thereof. In this regard, the package according to the present invention belongs to the MLCP category.

Further, the package according to the present invention is arranged as follows;

(1) electric-power supply connections to the IC signal transmitting wiring connections to the IC are not disposed on the same surface, and the signal transmitting wiring are formed on only one of the ceramic plates;

(2) electric-power supplying wiring are formed by providing metallized surfaces on the entire peripheries of the ceramic plates;

(3) termination resistors are formed by a thick film printing processor a thin-film process on the surface on which the electric-power supply wiring is formed; and (4) a metal base plate having good heat conductivity is formed as a semiconductor chip mounting portions and is fixed to the MLCP having the above features (1) through (3).

As used herein, the term "electric-power supplying wiring" includes the ground wiring.

BRIEF DESCRIPTION OF THE DRAWINGS

FIG. 3 is a cross section showing the integrated circuit package according to the present invention; and FIG. 4 is an enlarged plan showing a resistor portion of the package.

DESCRIPTION OF THE PREFERRED EMBODIMENTS

The package according to the present invention will be described with reference to the accompanying drawings.

Figure 2:
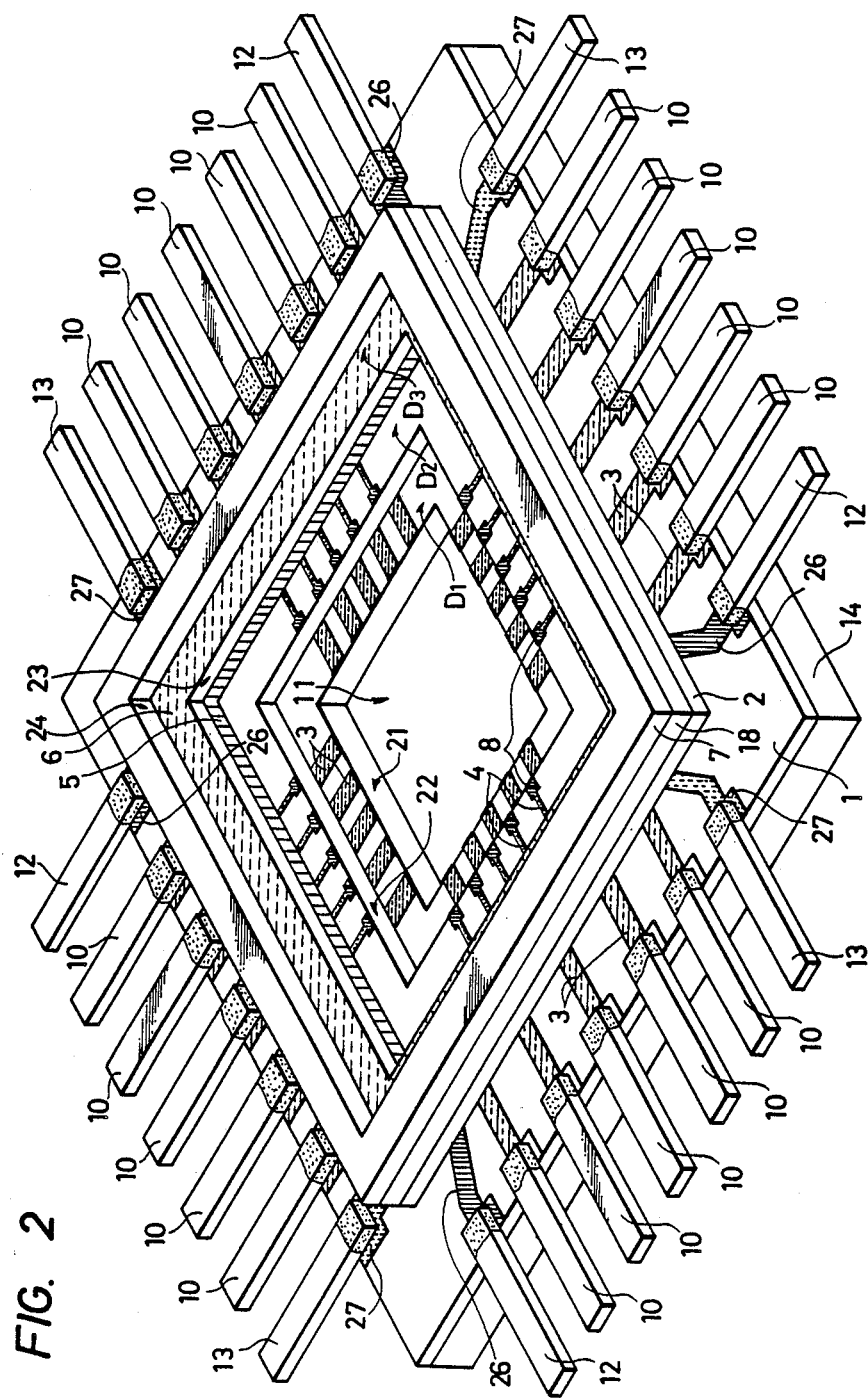
FIG. 2 is a perspective view showing an embodiment of an integrated circuit package according the present invention.

FIG. 2 is a perspective view showing a preferred embodiment of an integrated circuit package according to the present invention. FIG. 3 is a cross section showing the same.

In this embodiment, four ceramic plates are stacked one on another. Since a cover plate is attached after the IC chip has been mounted, the resultant package has a laminated structure of five ceramic plates. If a bottom plate 14 is made of ceramics, the package has a lamination structure of six ceramic plates.

Excluding the bottom plate 14, a first ceramic plate 1, a second ceramic plate 2, a third ceramic plate 18, and a fourth ceramic plate 7 are stacked in that order from the bottom. Each of those plates is a square ceramic plate having a square opening formed at its central portion. The first ceramic plate 1 has a first opening 21, and each side thereof has a length represented by $W_1$. The second ceramic plate 2 has a second opening 22, and each side thereof has a length represented by $W_2$. The third ceramic plate 18 has a third opening 23, and each side thereof has a length represented by $W_3$. The fourth ceramic plate 7 has a fourth opening 24, and each side thereof has a length represented by $W_4$.

In the center of the lamination of those ceramic plates, the openings 21 through 24 ar formed in a stepwise fashion. That is, the following inequality (1) is established.

$$W_1 < W_2 < W_3 < W_4 \qquad (1)$$

If the widths of stepped portions of the ceramic plates 1, 2, and 18 are represented by $D_1$, $D_2$, and $D_3$, respectively, the widths $D_1$, $D_2$ and $D_3$ are obtained by the following expressions:

$$D_1 = (W_2 - W_1)/2 \qquad (2)$$

$$D_2 = (W_3 - W_2)/2 \qquad (3)$$

$$D_3 = (W_4 - W_3)/2 \qquad (4)$$

The external side lengths of the second ceramic plate 2 through the fourth ceramic plate 7 are equal to each other, and therefore when those ceramic plates are stacked together, the external side surfaces thereof can be made even.

The first ceramic plate 1 exclusively has only metallized wiring connections 3 for signal transmission to and from the IC. The signal transmitting wiring connection include both input and output signal lines, that is, they exclude electric-power supplying wiring connection and ground wiring connections to the IC. The term "exclusively" as here used means that all the signal transmission wirings are confined to this layer. The term "only" means that neither power supplying wiring nor ground wiring is provided.

The signal transmitting metallized wirings 3 are radially formed from external edges of the first ceramic plate 1 to the first opening 21. Although five signal lines are illustrated for every side in FIG. 2, typically a larger number of signal lines are formed in an actual case. In order to simplify the drawings the other signal lines are omitted.

The term "metallized" broadly means that a coating is formed with a metal material. Here, the term "metallized" means that a metal layer is formed on a surface of the ceramic plate so as to form an electric conductor on the surface.

A portion of the metal layer contacting the ceramic material is made of tungsten (W). If the metallized portion is not exposed to the outside, a metal layer of tungsten may be used as it is. If the metallized portion is exposed to the outside, on the contrary, the metal layer should further be coated with gold (Au). In some cases, another metal layer may be sandwiched between the layer of tungsten and the layer of gold. Generally, the metal layer is constituted by a thick film having a thickness of 10 μm to 30 μm.

In FIG. 2, the signal transmitting metallized wirings 3 on the first ceramic plate 1 are shown hatched. (This hatching does not represent a section.) In FIG. 2, all the hatched portions represent metallized surfaces.

The signal transmitting metallized wirings 3 continue from the first opening 21 to the external edges of the first ceramic plate 1. (The signal transmitting metallized wirings 3 are not discontinued at their midpoints and they are merely hidden by the second ceramic plate 2, etc., in the drawings.)

Lead frames 10 for signal transmission are attached by brazing to the respective signal transmitting metallized wirings 3 at the external edges of the ceramic plate 1.

The metal bottom plate 14 is fixed to the undersurface of the first ceramic plate by a brazing material 34. A semiconductor integrated circuit chip is die-mounted on a gold-plated metal bottom plate center 11. (The space at the center 11 of the metal bottom plate 14 is sometimes referred to as a cavity.)

The metal bottom plate 14 is connected to a grounded metallized surface 5 via through holes formed in the MLCP so as to connect it to ground potential. The signal transmitting metallized wirings 3 are vertically separated from the ground surface (of the ground potential) by the thickness $T_1$ of the first ceramic plate 1. In this embodiment, the thickness $T_1$ of the first ceramic plate 1 is selected to be 0.3 mm.

The signal transmitting metallized wirings 3 and the ground surface form a capacitor having a thickness $T_1$ therebetween to thereby produce the capacitance C.

The line width U of each of the metallized wirings 3 is made constant. In this embodiment, the width U is selected to be 0.12 mm.

The inductance L and capacitance C of the signal transmitting metallized wirings 3 per unit length are determined by the values of $T_1$, $T_2$, and U. The characteristic impedance is represented by $\sqrt{L/C}$, and it is necessary to make this characteristic impedance constant. To this end, $T_1$, $T_2$, and U are made constant through substantially the whole length of the signal transmitting metallized wirings 3.

In the case where alumina $Al_2O_3$ is used to form the ceramic plate and when the values are set to $T_1 = T_2 = 0.3$ mm and $U = 0.12$ mm, the characteristic impedance of the wirings will be 50 Ω.

However, the values $T_1$ and U are not unconditionally determined by the characteristic impedance $Z_0$. That is, $T_1$ and U may be set to values other than those described above.

The width of each of the signal transmitting metallized wiring connections 3, however, is widened to 0.5 mm at the external edges of the first ceramic plate 1 (FIG. 2). This is for the purpose of firmly brazing the lead frames 10 to the respective signal transmitting metallized wirings 3.

Although first ceramic plate 1 exclusively has the signal transmitting metallized wirings 3, metallized wiring layer traces 26 and 27 for electric power supply are additionally formed to extend from the external edges of the first ceramic plate 1 toward the inside. These wiring layers 26 and 27 do not however, extend to the area pf signal transmitting metallized wiring connections 3, but rather end before surface 21. Lead frames 12 and 13 are attached by brazing to those electric power supplying metallized wiring traces 26 and 27, respectively.

The electric power supplying metallized wirings 26 and 27 appear to stop at the first stepped portion $D_1$. These wirings, however, extend to portions directly under the second and third ceramic plates 2 and 18. The metallized wiring traces 26 and 27 are connected to the grounded metallized surface 5 and a power source metallized surface 6 via through-holes 31 and 32 respectively.

As described above, on the first ceramic plate 1, there are provided all the lead frames 10, 12 and 13, all the signal transmitting metallized wirings 3, and the electric power supplying metallized surface 26 and 27 which carry power to through holes 31 and 32 but do not extend to the first opening 21.

Next, a description will be given concerning the second ceramic plate 2. In the package according to the present invention, this layer is an important consideration.

A grounded metallized surface 5 is formed continuously along the four external side edges of the second ceramic plate 2 in the form of a frame. The grounded metallized surface 5 is partially exposed, but the remainder thereof is hidden under the third ceramic plate 18.

In this embodiment, the thickness $T_2$ of the second ceramic plate 2 is selected to be 0.3 mm.

In addition to the grounded metallized surface 5, metallized electrodes 8 are formed at the exposed second stepped portion $D_2$ of the second ceramic plate 2 between the second and third openings 22 and 23 formed in the second and third ceramic plates 2 and 18, respectively. FIG. 4 is an enlarged plan showing this portion.

The metallized electrodes 8 are formed at the front portion of the stepped portion $D_2$ opposite the second opening 22. Resistors 4 are formed between the grounded metallized surface 5 and the metallized electrodes 8. In this embodiment, the resistance value is selected to be 50 Ω. The resistors were formed by a thin film process.

The power source metallized surface 6 is formed over the whole peripheral portion of the third ceramic plate 18.

The third stepped portion $D_3$ can be defined as a region between the third opening 23 of the third ceramic plate 18 and the fourth opening 24 of the fourth ceramic plate 7. The power source metallized surface 6 is partly hidden by the fourth ceramic plate 4. The power source metallized surface 6 is merely partly exposed to the third state portions $D_3$.

The grounded metallized surface 5 and the power source metallized surface 6 are formed continuously on the whole peripheral portions of the four side edges of the second ceramic plate 2 and the third ceramic plate 18, respectively.

One advantage of this arrangement is that although an IC chip has a plurality of ground electrode portions and a plurality of power source electrode portions, even if a large number of such electrode portions are present at any position, it is possible to provide wire-bonding from the positions of the grounded metallized surface 5 and the power source metallized surface 6 nearest to those electrode portions. Therefore, it is easy to form wire bonding and it is able to make the wires short.

Another advantage is that since the power source metallized surface 6 and the grounded metallized surface 5 are vertically laminated one on the other through the thin ceramic plate, a large capacitance can be effectively formed therebetween. As a result, noise mixed in the power source line can be effectively reduced, thereby making it possible to stabilize the power source level of the integrated circuit.

The grounded metallized surface 5, the power source metallized surface 6, and a metallized surface 34 formed on the bottom plate 14 are connected to the electric power supply metallized traces 26 and 27 via the through-holes 31, 32 and 33 vertically formed through the respective ceramic plates.

Unlike the signal lines, since the power source lines are not required to serve for making the characteristic impedance constant, the power source wirings may vertically connected to each other via the through-holes.

In order to simplify the above explanation, the case where a single power source is used has been described. In the case of using two power source, however, it suffices to make the arrangement such that a fourth ceramic plate is laminated on the third ceramic plate 18 and a metallized surface of the newly provided power source is formed on the fourth ceramic plate at its upper surface. That is, in the case of using power sources, it is necessary to provide (n+1) power source metallized surfaces (including a ground metallized surface) and therefore it is sufficient to stack (n+1) ceramic plates on the first ceramic plate 1 on which the signal transmitting metallized wirings 3 are formed. Further, a ceramic plate is provided on the uppermost metallized surface so as to serve as a support to which a cover plate is attached.

In this embodiment, the fourth ceramic plate 7 acts as a support for the cover plate. After the IC chip has attached to the metal bottom plate center 11 and wire-bonding has been performed, the ceramic cover plate (not shown) is attached to the fourth ceramic plate 7 through an adhesive agent.

The input signal transmitting metallized wiring of the signal transmitting metallized wirings 3 is connected to the nearest one of the metallized electrodes 8 formed on the uppermost ceramic plate through a wire 35. FIG. 4 shows this state.

The metallized electrode 8 is connected to the grounded metallized surface through the resistor R (50 Ω). The input signal transmitting metallized wiring of the signal transmitting metallized wirings 3 is connected to the metallized electrodes 8, and is therefore terminated by the characteristic impedance (50 Ω). The termination resistor is required for terminating the input signal line, but is not required for the output signal line.

The distribution may be different in number between the output and input signal lines depending on the type of the IC chip.

In order to be effective for any type of IC chip, the number of resistors 4 should be made equal to the number of signal lines. In this embodiment, the number of resistors 4 is made equal to the number of all the signal lines.

Since at least one output signal line must be provided, however, it is sufficient to provide the resistors 4 in a number equal to the total number of all signal lines minus one In this embodiment, only the input signal line is terminated by the characteristic impedance 50 Ω; however, the number of resistors can be made equal to the total number for all signal lines so that the resistor can be provided also for the output signal line in accordance with the requirement at hand.

Further although the resistors are formed between the signal line and the grounded metallized surface in this embodiment, an arrangement may be employed where one of the power sources is used in place of the grounded metallized surface to thereby apply a DC level to the signal line, or two resistors or more may be formed between two or more power sources so as to provide termination.

To obtain good thermal conductivity for the IC chip mounting portion, as shown in FIG. 3, the metal bottom plate 14 is attached by brazing to the lower layer portion 1 of the HLCP.

For the metal used in the case, it is preferable to use an elemental metal such as Cu, Mo, or the like; however, it is effective to use cladding layer of, for example, Cu/Ni-alloy/Cu, Cu/Mo/Cu, or the like, or a sintered material of CuW, CuMo, or the like because those materials have large thermal conductivity and thermal expansion coefficient similar to those of alumina, which is the main constituent element of the package, and that of a semiconductor chip of Si or GaAs. Particularly, a sintered material of CuW or CuMo containing Cu by 5 to 25% by weight is effectively used for the package because the heat conductivity thereof is 0.45 to 0.60 cal/cm sec °C., which is about ten times as large as that of alumina.

In the case where heat is generated not only from the semiconductor chip but also from the termination resistor portions, the need increases for such a package to have a good cooling property as described above.

In accordance with the invention as described above, the characteristic impedance of the signal lines can be made uniform.

That is, all the signal transmitting metallized wirings 3 are formed on the first ceramic plate 1 and disposed parallel to the ground metallized surface formed on the bottom plate 14 through the thickness $T_1$ of the first ceramic plate. If the line width U of each of the metallized wirings is made constant, the values of L and C of the metallized wirings per unit length will be constant, and hence the characteristic impedance $\sqrt{L/C}$ will be constant.

Figure 1:
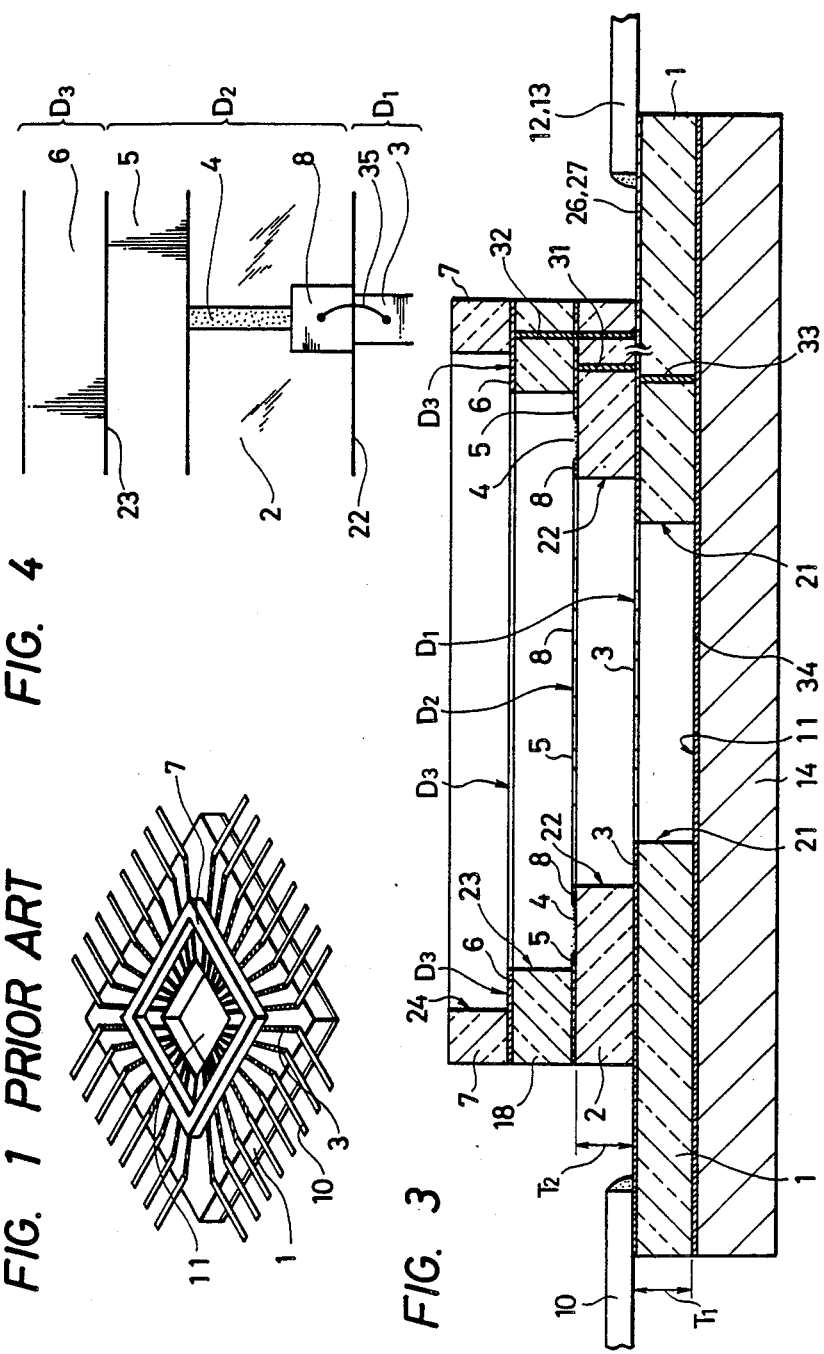
FIG. 1 is a perspective view showing an example of a conventional integrated circuit package.

In the package in which the ground metallized surface and the signal lines are formed on the same plate surfaces shown in FIG. 1, the values of L and C vary depend on the lengths. Even if L is made constant, the characteristic impedance $\sqrt{L/C}$ does not become constant.

The electric power supply metallized wiring 26 and 27 are also formed on the first ceramic plate 1. The capacitance C is further formed between the metallized wiring traces 26 and 27 and the signal transmitting metallized wirings. This capacitance C, however, is negligible because it is considerably smaller than that between the signal transmitting metallized wiring and the ground metallized surface formed on the directly underlying bottom plate.

The input signal transmitting metallized wiring can be terminated by a resistance equal to the characteristic impedance. Therefore, the input signals is not reflected by the metallized wirings, and thus all the input signal power can enter the IC.

Further, even if the number of wirings is increased, the bonding wires are not made long. This is because the portion where the electric power supplying wirings are formed is separated from the portion where the signal transmitting wirings are formed. Even if a plurality of power source are used or a power source is required for many portions of the IC chip, the electric power supplying wirings can be formed on other laminated ceramic plates.

It is sufficient to form only the signal transmitting metallized wirings 3 on a portion of the first ceramic plate 1 opposite the first opening 21. As a result, the size of the IC chip is not so different from that of the first opening.

Accordingly, the wires for connecting the signal transmitting metallized wirings 3 and the IC chip signal electrodes to each other may be made short.

In the case of signal processing at a high speed of several hundreds Mb/s, it is preferable to use a signal transmitting wire of a width of 1 mm or less. This can easily be realized.

The wires for connecting the over source lines and the power source electrode of the IC to each other, on the contrary, may be made long to some extent. Since those power source lines are formed on the upper stepped portions $D_2$, $D_3$, ..., the wires are long. However, this causes no problem.

The electric power supply metallized surface and the ground metallized surface are formed over the whole peripheral portions so that, even if large numbers of power sources and large numbers of ground electrodes are present in desired portions of the IC chip, the necessary connections can be performed using very short wires. Also wire-bonding can be easily performed.

A package having a good cooling property is obtained by using the metal bottom plate having a good thermal conductivity for the portion for directly mounting the semiconductor chip. Specifically, it is possible to reduce thermal resistance to 15° to 20 °C./W, in comparison with a package formed only by alumina, by using a sintered material of 15 wt % Cu-W having a thermal conductivity of 0.55 cal/cm sec °C. for the metal plate. It is further possible to obtain a thermal resistance of 5 °C./W by attaching heat radiating fins to the external surface of the metal bottom plate so as to perform air-cooling. Thus, a package having good reliability can be provided. Further, in the package according to the present invention, heat generated from the termination resistor portion during the operation of the IC can be sufficiently discharged, and a change in resistance due to a temperature rise in the package can be adequately suppressed so that an improvement of the cooling property of the package according to the present invention is confirmed.

What is claimed is:

1. An integrated circuit package comprising:
   a first ceramic plate formed with a first opening at its central portion and provided with a plurality of signal transmitting metallized wiring connections on its upper surface extending from said first opening to respective external edges of said first ceramic plate, and having a plurality of electric power supplying metallized wiring traces extending from said external edge to an intermediate portion of said first ceramic plate inward of said first opening;
   a plurality of ceramic plates, laminated on said first ceramic plate, and each having a respective opening, each of which is larger in size than said first opening and each having a larger opening than any openings on ceramic plates therebelow to form a stepwise increase in opening sizes, each of said ceramic plates having a metallized power-source, extending continuously along four sides of a surface thereof;
   a metal bottom plate of good thermal conductively fixed to a lower surface of said first ceramic plate and provided with an electric conductor on at least a whole upper surface thereof; and
   a plurality of signal transmitting lead frames, each fixed to an external end of one of said signal transmitting metallized wiring connections at said external edge of said first ceramic plate;
   a plurality of electric-power supplying lead frames, each fixed to an external end of a respective one of said electric-power supplying metallized wiring traces, said plurality of ceramic plates formed with a plurality of through-holes for connecting said electric-power supplying metallized wiring traces, said metalized power-source surface, and said electric conductor on the upper surface of said bottom plate to each other;

wherein a size of said wiring and thickness of said ceramic layers is maintained constant so that said signal transmission metallized wiring connections have a characteristic impedance determined by a ratio L/C of a capacitance C between the respective electric conductors on the upper surfaces of said metal bottom plate and a second ceramic plate, to an inductance L determined by said size of said wirings, is maintained constant.

2. An integrated circuit package comprising:

a first ceramic plate formed with a first opening at its central portion and provided with a plurality of signal transmitting metallized wiring connections on its upper surface, extending from said first opening to an external edge of said first ceramic plate and with a plurality of electric power supplying metallized wiring traces extending from said external edge to an intermediate portion of said first ceramic plate;

a plurality of ceramic plates laminated on said first ceramic plate and each having a respective opening, each of which is larger in size than said first opening and each having a larger opening than any openings on ceramic plates therebelow to form a stepwise increase in size of said opening, each of said ceramic plates having a metallized power-source surface extending continuously along four sides of a surface of said ceramic plate;

a metal bottom plate fixed on a lower surface of said first ceramic plate and provided with an electric conductor on at least a whole upper surface thereof;

a plurality of signal transmitting lead frame fixed to external ends of said signal transmitting metallized wiring connections at said external edge of said first ceramic plate; and a plurality of electric-power supplying lead frames fixed to external ends of respective ones of said electric-power supplying metallized wiring traces, said plurality of ceramic plates formed with a plurality of through-holes for connecting said electric-power supplying metallized wiring traces, said metallized power-source surface, and said electric conductor on the upper surface of said bottom plate to each other;

wherein a size of said wiring and thickness of ceramic layers is constant so that said signal transmission metallized wiring has a constant characteristic impedance determined by a ratio L/C of an electric capacitance C between said metal bottom plate and a conductor of a second ceramic plate, to an inductance L determined by said size of said wirings, at least one of said plurality of ceramic plates being provided with metallized electrodes adjacent its metallized power source surface, and with resistors having said characteristics impedance connecting with metallized electrodes to the metallized power source surface of said one ceramic plate, a number of said resistors being equal to or more than the number of input signal transmitting metallized wiring connections so that each said input signal transmitting metallized wiring connection is terminated with a resistance substantially equal to said characteristic impedance.

3. The integrated circuit package according to claim 2, in which said ceramic plates are made of alumina and said characteristic impedance is about 50 Ω.

4. The integrated circuit package according to claim 3, in which each of the respective thicknesses of said first and second ceramic plates is selected to be 0.3 mm, and the line width of each of said signal transmitting metallized wirings is selected to be 0.12 mm.

5. The integrated circuit package according to claim 4, in which the resistance of each of said resistors is selected to be about 50 Ω.

6. The integrated circuit package according to claim 2, in which said bottom plate is formed of a sintered material selected from the groups consisting of Cu, W CuMo containing Cu by 5 to 25% by weight.

7. The integrated circuit package according to claim 1, wherein each said ceramic plate of said plurality of ceramic plates is formed with at least four inner surfaces defining a perimeter, and inside of which is defined said respective opening, and wherein said metallized power-source surface extends along said surfaces defining said perimeter, and facing said respective opening.

8. The integrated circuit package according to claim 2, wherein each said ceramic plate of said plurality of ceramic plates is formed with at least four inner surface defining a perimeter, and inside of which is defined said respective opening, and wherein said metallized power-source surface extends along said surfaces defining said perimeter, and facing said respective opening.

9. The integrated circuit package according to claim 1, further comprising a ground ceramic plate having a metallized ground surface, said metallized ground surface connected to said through-holes, and a ceramic plate disposed on said plurality of ceramic plates, for supporting a cover plate, and provided at its central portion with an opening which is larger in size than said openings of said plurality of ceramic plates.

10. The integrated circuit package according to claim 2, further comprising a ground ceramic plate having a metallized ground surface, said metallized ground surface connected to said through-holes, and a ceramic plate disposed on said plurality of ceramic plates, for supporting a cover plate, and provided at its central portion with an opening which is larger in size than said openings of said plurality of ceramic plates.

11. The integrated circuit package according to claim 7, wherein said first ceramic plate has only said signal transmitting metallized wiring connections, which are only for signal connections, along a perimeter of said first opening.

12. The integrated circuit package according to claim 8, wherein said first ceramic plate has only said signal transmitting metallized wiring connections, which are only for signal connections, along a perimeter of said first opening.

* * * * *